United States Patent [19]

Saito et al.

[11] Patent Number: 4,598,254

[45] Date of Patent: Jul. 1, 1986

[54] MICROWAVE POWER DISTRIBUTING AND SYNTHESIZING DEVICE AND MICROWAVE POWER AMPLIFYING APPARATUS INCLUDING THE SAME

[75] Inventors: Toshiyuki Saito; Naofumi Okubo, both of Kawasaki; Yoshiaki Kaneko, Yokohama; Yasuyuki Tokumitsu, Isehara, all of Japan

[73] Assignee: Fujitsu Limited, Kawasaki, Japan

[21] Appl. No.: 630,240

[22] Filed: Jul. 12, 1984

[30] Foreign Application Priority Data

Jul. 12, 1983 [JP] Japan ................................ 58-125533

[51] Int. Cl.[4] ................................................ H03F 3/60
[52] U.S. Cl. ..................................... 330/286; 330/295; 333/125; 333/34; 333/251
[58] Field of Search ................................ 333/124–126, 333/135–137, 227, 230, 101, 103, 104; 331/56; 330/277, 286, 287, 295, 124 R

[56] References Cited

U.S. PATENT DOCUMENTS

| | | | |
|---|---|---|---|
| 2,550,524 | 4/1951 | Braden | 333/125 X |
| 2,659,031 | 11/1953 | Bokhove | 333/230 X |
| 3,001,160 | 9/1961 | Trousdale | . |
| 3,290,682 | 12/1966 | Ajioka | 333/137 X |
| 3,582,813 | 6/1971 | Hines | 331/56 |
| 3,873,935 | 3/1975 | Oltman, Jr. | 330/287 |
| 4,035,746 | 7/1977 | Covington, Jr. | 333/125 X |
| 4,074,265 | 2/1978 | True | . |
| 4,147,994 | 4/1979 | Thoren et al. | 331/56 |
| 4,175,257 | 11/1979 | Smith et al. | 330/287 |
| 4,188,590 | 2/1980 | Harp et al. | . |
| 4,238,747 | 12/1980 | Harp et al. | 330/287 X |

FOREIGN PATENT DOCUMENTS 0085393 1/1982 European Pat. Off. .
55-147011 11/1980 Japan .

OTHER PUBLICATIONS

European Search Report, Oct. 2, 1984, Berlin, Examiner: J. Breusing.

*Primary Examiner*—Paul Gensler
*Attorney, Agent, or Firm*—Staas & Halsey

[57] ABSTRACT

A microwave power distributing and synthesizing device includes: a first base and a second base facing the first base at a predetermined distance and having a hole. A coaxial line element including an inner conductive member coaxially penetrates through the hole of the second base and is spaced from an inner wall of the hole by the second base of a predetermined distance. The coaxial line element is supported on the first base at a bottom end and forms an antenna protruding from the hole of the second base into an input waveguide at a top end. At least one electric field distributing and synthesizing member is arranged perpendicularly to the coaxial line element and a plurality of waveguides are connected to the electric field distributing and synthesizing member. Also, a microwave power amplifying apparatus includes a first microwave power distributing and synthesizing device as described above, for receiving and distributing an input microwave signal; a plurality of amplifiers connected to output ports of the first microwave power distributing and synthesizing device; and a second microwave power distributing and synthesizing device as described above, having input ports connected to the amplifiers.

30 Claims, 36 Drawing Figures

Fig. 5
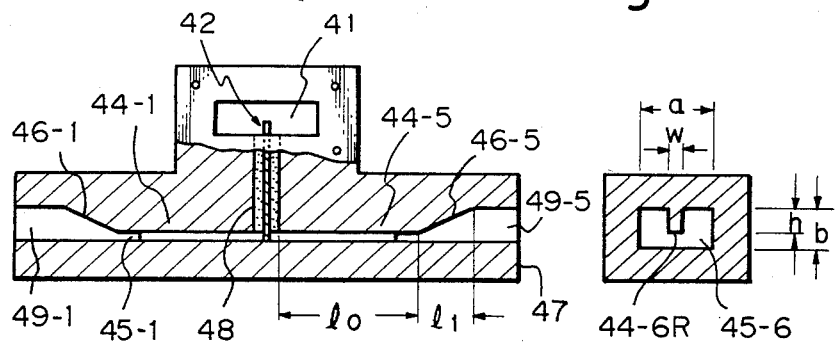
Fig. 6
Fig. 7
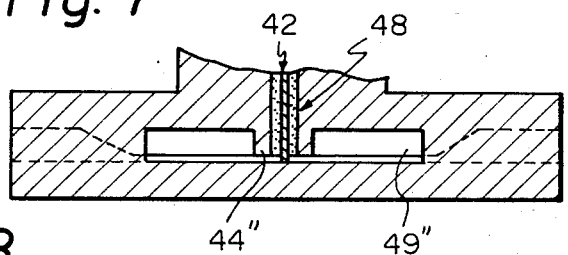
Fig. 8
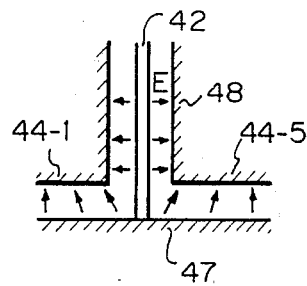
Fig. 9
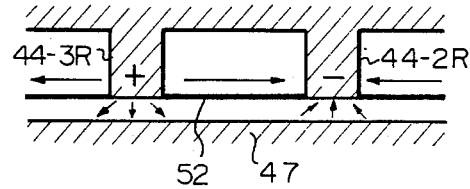
Fig. 10
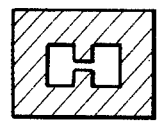

MICROWAVE POWER DISTRIBUTING AND SYNTHESIZING DEVICE AND MICROWAVE POWER AMPLIFYING APPARATUS INCLUDING THE SAME

CROSS REFERENCE TO RELATED APPLICATIONS

This application is related to application Ser. Nos. 571,811 and 593,429 filed Jan. 18, 1984, now U.S. Pat. No. 4,562,409, and Mar. 26, 1984, respectively, both of which have three of the inventors of this application in common, and both of which are assigned to the same assignee.

BACKGROUND OF THE INVENTION

1. Field of the Invention

The present invention relates to a microwave power distributor, a microwave power synthesizer, and a microwave power amplifying apparatus using the microwave power distributor and the microwave power synthesizer.

2. Description of the Prior Art

Recently, in order to ensure long service life and improve reliability and the maintainability of microwave signal amplifying apparatuses, semiconductor amplifying devices such as gallium arsenide field effect transistors (GaAs FET) have been used to replace the conventional traveling-wave tubes. In high-power capacity apparatuses, a plurality of such semiconductor amplifying devices must be provided due to the small, e.g., several watt output power of such devices. For this reason, the amplifying apparatuses must also be provided with a power distributor and power synthesizer. The power distributor splits the microwave input signal into a plurality of signals which are supplied to the semiconductor amplifying devices. The power synthesizer combines the signals amplified by the semiconductor amplifying devices to output a synthesized signal.

In conventional microwave power amplifying apparatuses, however, the power distributor, power synthesizer, and semiconductor amplifying devices are connected by coaxial cables. This results in a loss of power of high frequency microwave signals, for example, higher than 10 GHz, in the apparatus due to the increase in cable loss and the connector loss.

SUMMARY OF THE INVENTION

An object of the present invention is to provide a microwave power distributing and synthesizing device suitable for a microwave power amplifying apparatus and enabling reduced power loss, especially in the high-frequency band.

Another object of the present invention is to provide a microwave power amplifying apparatus using the above microwave power distributing and synthesizing device.

In accordance with the present invention, there is provided a microwave power distributing and synthesizing device comprising: a first base; a second base facing the first base at a predetermined distance and having a hole; a coaxial line including an inner conductive member coaxially penetrating through the hole of the second base and spaced from an inner wall of the hole of the second base at a predetermined distance, supported on the first base at one end and forming an antenna protruding from the hole of the second base at other end; at least one electric field distributing and synthesizing means arranged perpendicularly to and at one end of the coaxial line; and a plurality of waveguides connected to the electric distributing and synthesizing means.

In addition, in accordance with the present invention, there is provided a microwave power amplifying apparatus comprising: a first microwave power distributing and synthesizing device, as described above, for receiving and distributing an input microwave signal; a plurality of amplifiers connected to outputs of the first microwave power distributing and synthesizing device; and a second microwave power distributing and synthesizing device as described above, having inputs connected to the amplifiers.

BRIEF DESCRIPTION OF THE DRAWINGS

Other objects and features of the present invention will be clearly understood from the following description with reference to the accompanying drawings, wherein:

FIG. 5 is a partially sectional view of the power distributor shown in FIG. 3, taken along the line X–X';

FIG. 6 is a sectional view of a channel in the power distributor shown in FIG. 3 taken along the line R–R';

FIG. 7 is a sectional view of the power distributor shown in FIG. 3, taken along the line Z–Z';

FIG. 8 is an enlarged view of part of the power distributor shown in FIG. 5;

FIG. 9 is a sectional view of the power distributor shown in FIG. 3, taken along the line Q–Q';

FIG. 10 is a sectional view of another embodiment of the ridge shown in FIG. 6;

FIGS. 19 to 22 show modifications of the tip of the wedge shown in FIG. 16, wherein FIG. 21 is a side view of a third modification.

DESCRIPTION OF THE PREFERRED EMBODIMENTS

Figure 1:
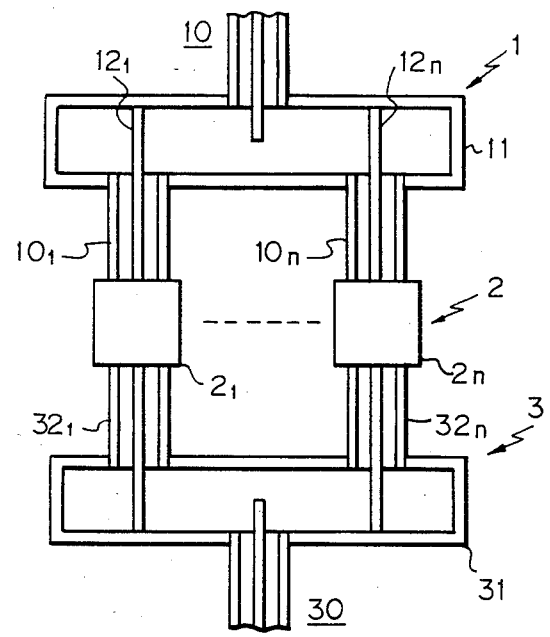
FIG. 1 is an illustration of a prior art microwave power amplifying apparatus.

Before describing preferred embodiments of the present invention, a prior art microwave power amplifying apparatus will be briefly described for reference purposes. FIG. 1 is an illustration of a prior art microwave power amplifying apparatus. The apparatus includes a power distributor 1 consisting of a resonator 11 and a plurality of coaxial cables $10_1$ to $10_n$, a plurality of semiconductor amplifiers $2_1$ to $2_n$, and a power synthesizer 3 consisting of a plurality of coaxial cables $32_1$ to $32_n$ and a resonator 31. A microwave signal is applied to the power distributor 1 through an input coaxial cable 10 and divided into n signals. The divided microwave signals are amplified at the amplifiers $2_1$ to $2_n$ and synthesized at the synthesizer 3. The finally amplified and synthesized microwave signal is output to an output coaxial cable 30.

In the power amplifying apparatus shown in FIG. 1, the power of each channel is equally distributed and the phases of each of the distributed signals in the channels match. However, the power amplifying apparatus includes coaxial cables for connecting the distributor and amplifiers and the amplifiers and synthesizer. Accordingly, there is a power loss when the frequency of the input microwave signal is high, for example, over 10 GHz (X band); the exact loss depending on the frequency. Also, the smaller the size of the distributor and the synthesizer, the longer the relative length of the coaxial cables and the greater the power loss.

Figure 2:
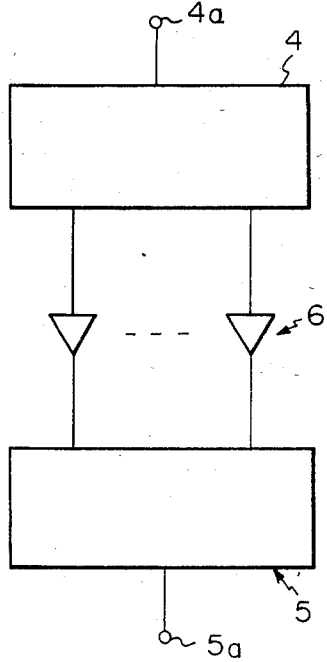
FIG. 2 is a block diagram of a microwave power amplifying apparatus in accordance with the present invention.

Embodiments of the present invention will now be explained. FIG. 2 is a block diagram of a microwave power amplifying apparatus in accordance with the present invention. The apparatus is formed by a power distributor 4, a plurality of semiconductor amplifiers 6, and a power synthesizer 5, as shown in FIG. 2. The basic operation of the apparatus is also similar to that of the apparatus shown in FIG. 1. Microwave signal power applied to an input terminal 4a is equally distributed with the same phase by the power distributor 4, the distributed microwave signals are individually amplified by the individual amplifiers 6, the amplified signals are combined by the power synthesizer 5, and the amplified and combined microwave signal is output to an output terminal 5a. The apparatus of the present invention, however, differs from the conventional apparatus in the construction of the power distributor 4 and power synthesizer 5 and the characteristics and effects thereof.

Figure 3:
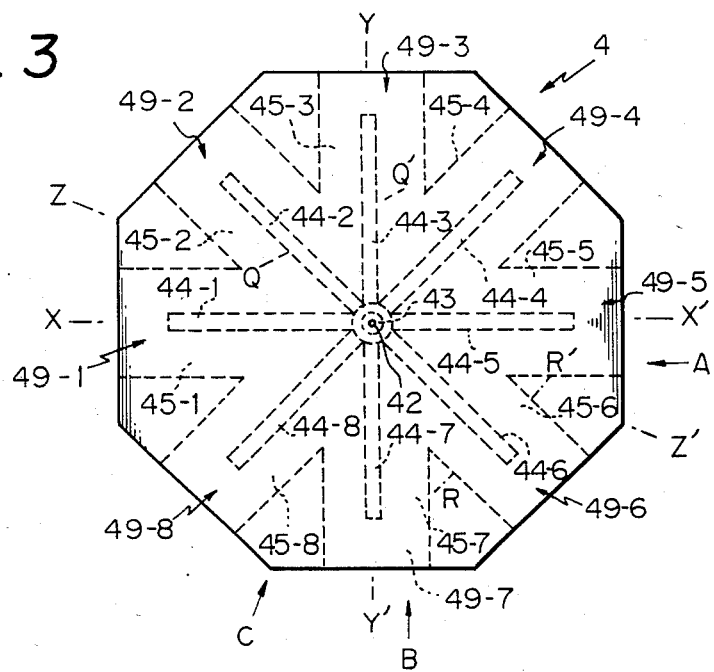
FIG. 3 is a plan view of a first embodiment of a power distributor of the apparatus shown in FIG. 2.
Figure 4:
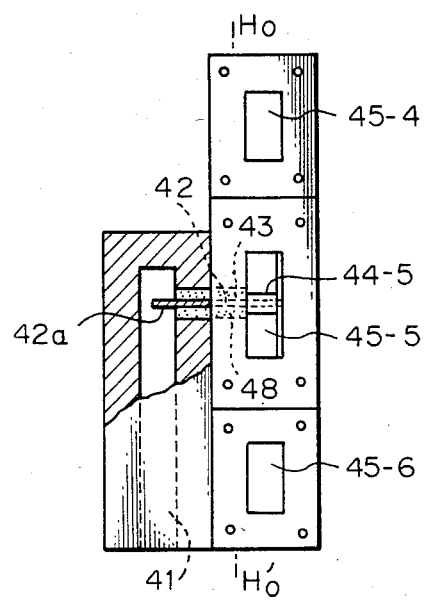
FIG. 4 is a side view of the power distributor shown in FIG. 3, taken in the direction of an arrow A.

A first embodiment of the power distributor 4 shown in FIG. 2 will be described with reference to FIGS. 3 to 10. FIG. 3 is a plan view of the power distributor 4. The broken lines in FIG. 3 show elements of the distributor 4, along the line $H_0$-$H_0'$ in FIG. 4. FIG. 4 is a partially sectional side view of the power distributor 4, taken in the direction of an arrow A in FIG. 3. FIG. 5 is a sectional view of the power distributor 4, taken along the line X-X' shown in FIG. 3. FIG. 6 is a sectional view of a channel, provided with a ridge, in the power distributor 4, taken along the line R-R' shown in FIG. 3. FIG. 7 is a sectional view of a center portion of the power distributor 4, taken along the line Z-Z' of FIG. 3. The power distributor has eight distributing channels 45-1 to 45-8.

An input microwave signal to be amplified propagates along in an input waveguide 41 and is applied to an antenna 42a formed by one end of an internal conductor 42 in a coaxial line path. Accordingly, the signal applied at the antenna 42a is converted into a coaxial mode. The other end of the inner conductor 42 in the coaxial line path is supported by a base 47 so that the inner conductor 42 is installed coaxially and spaced, from a cylindrical inner wall 48 of a conductor. Air or a dielectric is disposed between an outer conductive member (the inner conductive wall) 48 of the coaxial line path and the inner conductive member 42. Consequently, the microwave signal converted into the coaxial mode at the antenna 42a propagates with a transverse electromagnetic (TEM) mode in a path between the inner conductor 42 in the coaxial line path and the inner wall 48. The TEM mode signal consists of a transverse electric field and a transverse magnetic field. The TEM mode signal reaches the base 47.

The power distributor 4 includes eight ridge distributing paths 44-1 to 44-8 separated from the base 47 by a predetermined distance and radially extending therefrom with equal angular spacing in a plane perpendicular to the inner conductor 42. A longitudinal sectional view of the ridge distributing paths is shown in FIG. 5. A cross sectional view of one of the ridge distributing paths is shown in FIG. 6. The ridge distributing paths 44-1 to 44-8 form part of the inner wall 48 at one end and have inclined portions 46-1 to 46-8 at the other end. In the channels 45-1 to 45-8, formed radially from and perpendicularly to the inner conductor 42, each of the ridge distributing paths 44-1 to 44-8 forms a ridge line in each of rectangular waveguides 49-1 to 49-8 each having a width a, and height b. A ridge, for example 44-6R, having a width w, height h, and length $l_0$ protrudes in each of the rectangular waveguides. The ridges terminate at the inclined portions 46-1 to 46-8. The ridge distributing paths 44-1 to 44-8 have the same construction and are separated by the same angle.

The mode of distribution and propagation of the microwave signals in the ridge distributing paths will now be explained with reference to FIG. 8. The microwave signal propagated with the TEM mode in the coaxial line path to the bottom end (the base 47) of the inner conductor 42 is equally distributed between the inner ends of the ridge distributing paths 44-1 to 44-8 (adjacent to the inner conductor 42) and the base 47. Each of the equally distributed microwave signals at the inner ends of the ridge distributing paths 44-1 to 44-8 propagates radially with a ridge line mode (TEM mode) in the gap defined by the ridge and the base 47 towards each of the inclined portions 46-1 to 46-8. The ridge distributing paths perform electric field concentration.

Each of the microwave signals reaching the inclined portions 46-1 to 46-8 is further introduced to the waveguides 49-1 to 49-8. The gradients of the inclined portions 46-1 to 46-8 are the same and designed to smoothly propagate the microwave signals reaching the outer ends of the ridge distributing paths 44-1 to 44-8 into the waveguides 49-1 to 49-8. Strictly speaking, there is a partial radial mode of the propagation in the vicinity of the bottom end of the inner conductor 42 supported in the base 47. The individual semiconductor amplifiers 6 are connected to the outputs of the waveguides 49-1 to 49-8 of the power distributer. The power synthesizer 5 is in turn connected to the amplifiers.

As mentioned above, the microwave signal input at the antenna 42a propagates in the coaxial line path and is equally distributed at the inner ends of the ridge distributing paths 44-1 to 44-8. The distributed microwave signals are smoothly introduced into the waveguides 49-1 to 49-8. The power loss of a microwave signal propagating in the waveguide is considerably smaller than that in coaxial cable, because the waveguide has a large cross section and no dielectric loss. In accordance with the embodiment mentioned above, one can obtain a distribution of power of a microwave signal with the same phase, the same amplitude, and considerably less power loss over a wide range of high frequencies.

An additional embodiment for suppressing (eliminating) unnecessary higher order mode signals will be explained below with reference to FIG. 9. FIG. 9 is a sectional view of the power distributor shown in FIG. 3, taken along the line Q–Q'. In a normal mode, there is no unnecessary electric field between the two ridges 44-2R and 44-3R liable to adversely affect the propagation of the microwave. On the other hand, an electric field may be caused by reflection due to unbalanced load impedance in the circumferential direction of the power distributor. Such an electric field can cause the polarity between the ridges 44-2R and 44-3R shown in FIG. 9. The difference in potential between the ridges 44-2R and 44-3R would have an adverse effect on the propagation of the microwave. The arrows indicate the direction of the electric field. In the embodiment illustrated in FIG. 9, resistance films 52 are provided between the tips of the ridges and parallel to the direction of the electric field. The resistance films 52 absorb the unnecessary electric field and equalize the potentials between the ridges. Consequently, no electric field appears between the ridges. In this regard, it should be noted that, even in the normal mode, the resistance films 52 do not adversely influence the microwave signal.

Normally, the resistance films 52 are provided in every gap between the tips of the ridges, however, they can be symmetrically provided concerning the coaxial inner conductor 42. The resistance film can be formed by, e.g., vapor deposition of resistance material on a mica film, vapor deposition of nickel-chrome (Ni-Cr) on a dielectric film, or vapor deposition of nitrogen-tantalum on a dielectric film.

As mentioned, provision of a resistance film between the ridges enables elimination of an unnecessary electric field, further reducing the power loss, and at the same time improving the nature of the distributed and propagated microwave signals.

Generally, the size of the power distributor is decided by the characteristic impedance and other parameters. The following are the actual dimensions of a power distributor 4 used for the 30 GHz band:
Diameter of inner conductor: 0.65 mm
Inner diameter of outer conductor (diameter of inner wall of coaxial line path): 2.1 mm
Inner width of waveguide a: 8.6 mm
Inner height of waveguide b: 4.3 mm
Width of ridge w: 0.9 mm
Height of ridge h: 4.05 mm Accordingly, the gap between the ridge and the base is 0.25 mm, the length $l_1$ of the inclined portion is greater than $\lambda/4$ (where $\lambda$: the wavelength of the microwave signal), and the length of the ridge $l_0$ is approximately 22.5 mm.

FIG. 10 is an alternative embodiment of the ridge shown in FIG. 6. In FIG. 10, there are two ridges facing each other. The microwave propagates in the gap between the ridges.

The input waveguide 41 shown in FIGS. 4 and 5 is not essential to the present invention and may be, for example a transmission line of a microwave integrated circuit (MIC) or a normal coaxial line path.

It should be clearly understood that the power distributor 4 described above can also be used for the power synthesizer 5, whereby a combined output of the microwave signal can be obtained at the antenna 42a when microwave signals with the same phase and amplitude are input to each of the outer ends of the waveguides 49-1 to 49-8. A power synthesizer 5 of the same construction as the power distributor 4 described above features high performance and reduced power loss of the microwave signal. The same applies to the other embodiments of the power distributor described hereinbelow. Also, note that the power distributor and/or the power synthesizer can be used not only in a microwave power amplifying apparatus but also as independent devices.

Figure 11:
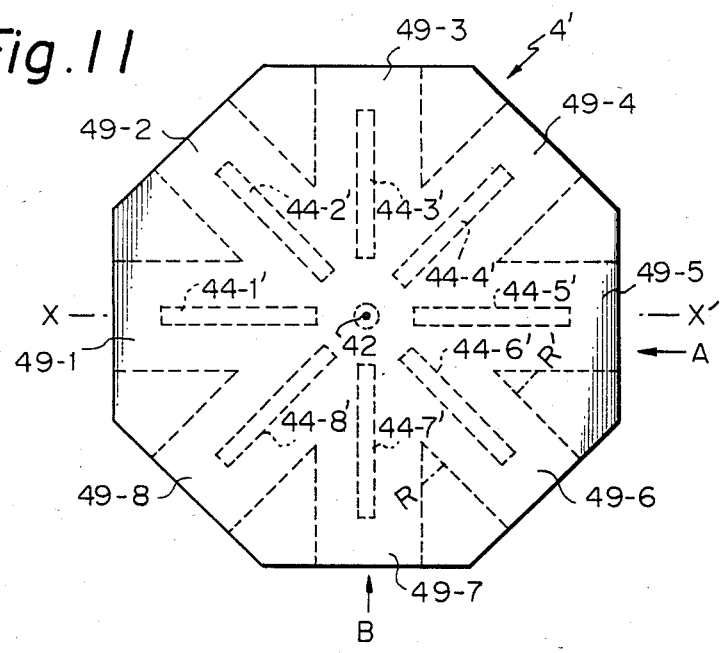
FIG. 11 is a plan view of a second embodiment of the power distributor of the apparatus shown in FIG. 2.
Figure 12:
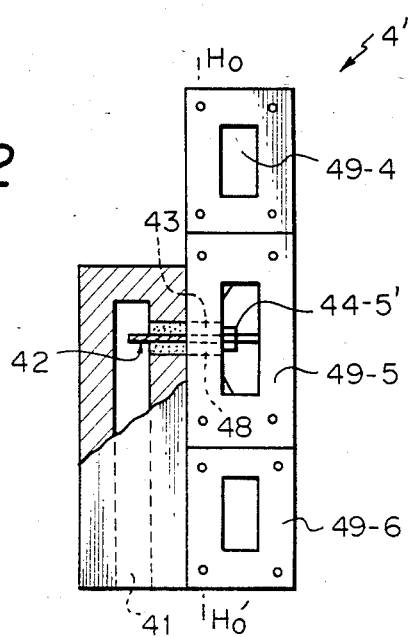
FIG. 12 is a side view of the power distributor shown in FIG. 11, taken in the direction of an arrow A.
Figure 13:
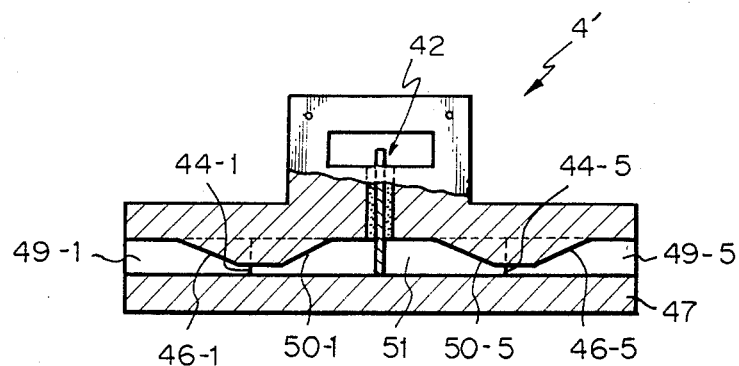
FIG. 13 is a sectional view of a part of the power distributor shown in FIG. 11, taken along the line X–X'.

Another embodiment of the power distributor will be explained below with reference to FIGS. 11 to 13. FIG. 11 is a plan view of the power distributor, with the dotted lines as they appear along the line $H_0$–$H_0'$ shown in FIG. 12. FIG. 12 is a side view of the power distributor, taken in the direction of the arrow A. FIG. 13 is a sectional view of a portion of the power distributor shown in FIG. 11, taken along the line X–X'. The power distributor 4' shown in FIGS. 11 to 13 is similar to the power distributor 4 shown in FIGS. 3 to 10, however, the ridge distributing paths 44-1' to 44-8' have two inclined portions 46-1 to 46-8 and 50-1 to 50-8 (FIG. 13). The second inclined portions 50-1 to 50-8 define a space 51 in the vicinity of the bottom end of the inner conductor 42. The cross section of the ridge distributing paths 44-1' to 44-8' taken along the line R–R' in FIG. 11 is similar that shown in FIG. 6.

The operation of the second embodiment will now be explained. The microwave signal with the TEM mode reaching the space 51 along the inner conductor 42 is converted into a radial mode. The converted signal is equally distributed and smoothly introduced into gaps between the ridges 44-1R' to 44-8R' and the base 47 by the inclined portions 50-1 to 50-8. The microwave signals introduced in the gaps propagate with the ridge line mode and travel to waveguides 49-1 to 49-8 through the inclined portions 46-1 to 46-8, which can smoothly diffuse the microwave signals. Due to the provision of the inclined portions 50-1 to 50-8 in the power distributor 4', the power loss of the microwave is further reduced from that of the power distributor 4 of the first embodiment.

The actual dimensions of the power distributor 4' for 30 GHz are as follows:

Inner width of ridge distributing path a: 8.6 mm
Inner height of ridge distributing path b: 1.5 mm
Width of ridge w: 0.9 mm
Height of ridge h: 1.25 mm Accordingly, the gap between the ridge and the base is 0.25 mm, the height of the space 51 is less than $\lambda/4$, preferably less than $\lambda/6$, e.g., 1.5 mm, the length of the inner inclined portions 50-1 to 50-8 is more than $\lambda/4$, and the length of the outer inclined portions 46-1 to 46-8 is more than $\lambda/4$. Other dimensions are same as those of the first embodiment.

Two ridges can be provided facing each other in the power distributor 4', as shown in FIG. 10. Also, the ridge can be formed on the side of the base 47 instead of on the top.

Figure 14:
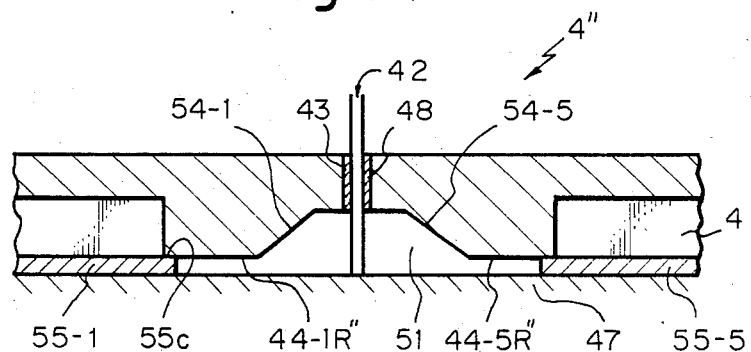
FIG. 14 is a partially sectional view of a third embodiment of the power distributor including semiconductor amplifiers.
Figure 15:
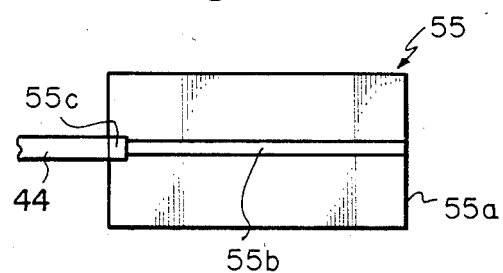
FIG. 15 is a plane view of the power distributing and amplifying apparatus shown in FIG. 14.

A third embodiment of the power distributor will be described below with reference to FIGS. 14 and 15. FIG. 14 is a sectional view of the power distributor 4" along with individual semiconductor amplifiers 55-1 to 55-8. The construction and the shape of the coaxial line path, dielectric 43, inner conductor 42, inner wall 48, and space 51 are similar to those of the second embodiment above. Ridges 44-1R" to 44-8R" of the distributing paths have inner inclined portions 54-1 to 54-8 similar to those as shown in FIG. 13; however, there are no outer inclined portions. Individual semiconductor amplifiers 55-1 to 55-5 are inserted into gaps between the base 47 and outer ends of the ridges 44-1R" to 44-8R". On each of the amplifiers is formed a micro-strip line 55b. The micro-strip line 55b is one of the transmission lines of a microwave integrated circuit (MIC) formed on a dielectric substrate 55a, as shown in FIG. 15. FIG. 15 is a plane view of one amplifier. An inner end 55c of the micro-strip line 55b is in contact with the outer end of the ridge 44, whereby an equally distributed microwave signal is directly introduced into the MIC transmission line and amplified in the amplifier. A distributor without inner inclined ridge portions can be also constructed.

Figure 16:
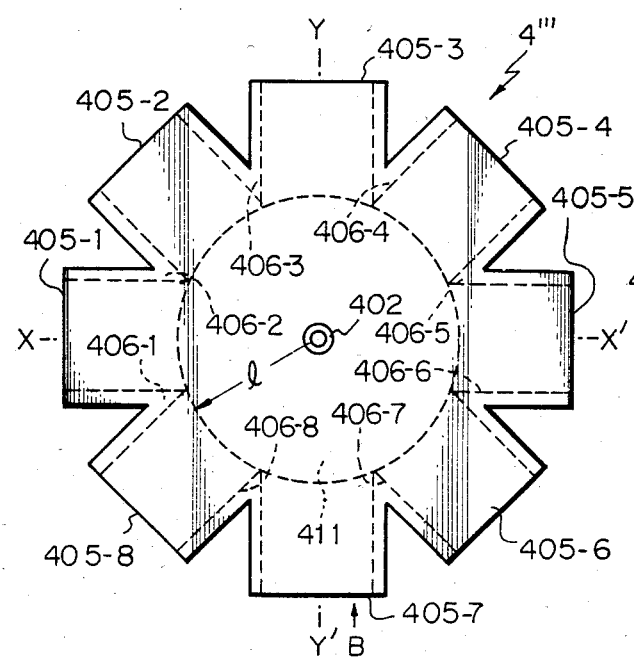
FIG. 16 is a plan view of a fourth embodiment of the power distributor.
Figure 17:
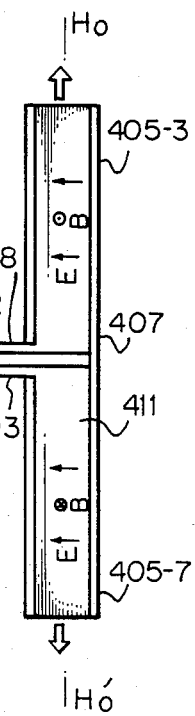
FIG. 17 is a sectional view of the power distributor shown in FIG. 16, taken along the line Y–Y'.
Figure 18:
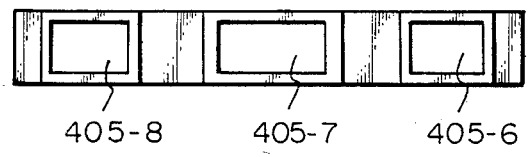
FIG. 18 is a side view of the power distributor shown in FIG. 16, taken in the direction of an arrow B.

A fourth embodiment of the power distributor will be explained below with reference to FIGS. 16 to 18. FIG. 16 is a plan view of the power distributor 4''', with the dotted lines as they would appear along the line H$_0$–H$_0$' shown in FIG. 17. FIG. 17 is a side sectional view of the power distributor shown in FIG. 16, taken along the line Y–Y'. FIG. 18 is a side view of the power distributor shown in FIG. 16, taken in the direction of the arrow B. The power distributor 4''' comprises a coaxial line path 402 and eight waveguides 405-1 to 405-8 circumferentially positioned from the coaxial line path 402 and spaced at equal angles. A cylindrical space 411 is defined around the coaxial line path 402. In the power distributor 4''', although there are no ridge distributing paths, the waveguides 405-1 to 405-8 directly distribute the microwave signal.

The operation of the power distributor 4''' will be explained below. The microwave signal input to the outer end of the coaxial line path 402 propagates with a coaxial mode along the coaxial line path 402. The microwave signal reaching the cylindrical space 411 is converted to a radial mode and equally distributed in the waveguides 405-1 to 405-8. Each of the distributed microwave signals in the waveguides 405-1 to 405-8 propagates with a normal transverse electric mode in each of the waveguides. The power loss of a microwave of higher than X band frequency in the power distributor 4''' is smaller than that of a power distributor using coaxial cables.

In the power distributor 4''', there are wedge portions 406-1 to 406-8, each of which has an acute angle tip for convergence of the electric field of the microwave signal, as joint tips formed by the walls of neighboring waveguides. These wedge portions can reflect part of the microwave signals, which could have a detrimental effect on the power distribution, such as the phase characteristic, and might increase the power loss. Various types of wedges able to overcome this problem, will be described below with reference to FIGS. 19 to 22.

Figure 19A:
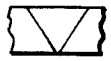
FIGS. 19(A), 19(B), and 19(C) are a front, plan, and sectional view of a first modification.
Figure 19B:
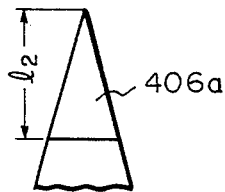
Figure 19C:

A first type of wedge is shown in FIGS. 19(A) to 19(C). FIG. 19(A) is a front view of the wedge, FIG. 19(B) a plan view, and FIG. 19(C) a side view. The wedge has a gradient 406a having a length l$_2$ which is equal to or greater than $\lambda/4$, where $\lambda$ is the wavelength of the microwave signal. The microwave signal is still reflected on the surface of the gradient 406a, however, the incident and the reflected waves have a phase difference of 180° due to the isosceles triangle shaped face of the gradient 406a. Therefore, the two reflected waves are cancelled, and the effect of the reflection is negligible.

Figure 20A:
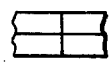
FIGS. 20(A), 20(B), and 20(C) are a front, plan, and sectional views of a second modification.
Figure 20B:
Figure 20C:
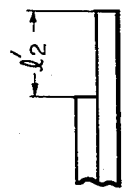

FIG. 20 shows a second type of wedge. FIG. 20(A) is a front view of the wedge, FIG. 20(B) a plane view, and FIG. 20(C) a side view. The wedge has a two-step tip instead of a gradient. The length l$_2$' of the step is equal to or greater than $\lambda/4$.

Figure 21:
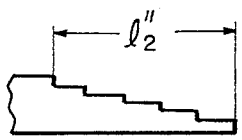

FIG. 21 is a cross-section along a line bisecting the wedge for a third type of wedge. The wedge in FIG. 21 has a plurality of steps having a length l$_2$" equal or greater than $\lambda/4$. Each of the steps is angled with symmetrical sides as shown in FIG. 20(B).

Figure 22A:
FIGS. 22(A) and 22(B) are plan and side views of a fourth modification.
Figure 22B:
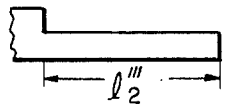

FIG. 22 shows a fourth type of wedge. FIG. 22(A) is a top view of the wedge, and FIG. 22(B) a side view. The wedge has a lower portion having a length l$_2$''' equal or greater than $\lambda/4$ and an upper portion with a cut flat side perpendicular to the longitudinal axis of the wedge.

The wedges shown in FIGS. 19 to 22 function to eliminate any adverse effect of reflection from the wedge 406 shown in FIG. 16.

The major dimensions of the power distributor 4''' for the 30 GHz band and of eight distribution channels shown in FIGS. 16 to 18 are as follows:
Inner width a of waveguide: 8.6 mm
Inner height b of waveguide: smaller than $\lambda/6$
Distance l from inner conductor 42 to tip of wedges 406-1 to 406-8 a/(2:sin $\pi$/n)=22.5 mm
(where n number of channels, n=8 in this example).

Figure 23:
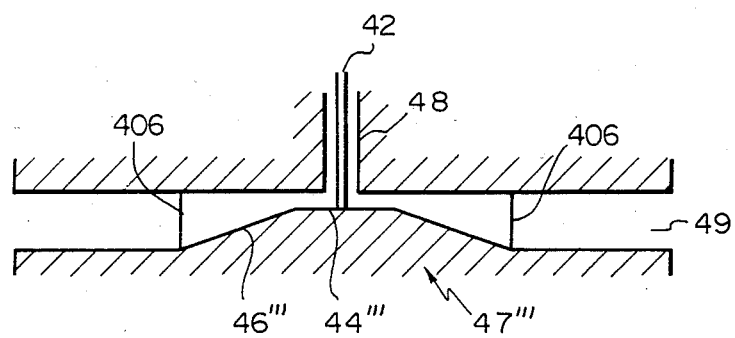
FIG. 23 is a sectional view of a fifth embodiment of the power distributor.

A fifth embodiment of the power distributor will be described with reference to FIG. 23. FIG. 23 is a sectional view of a power distributor. The power distributor includes a coaxial line path including an inner conductor 42 and a conductive inner wall 48, a base 47''' having a center flat portion 44''' and an inclined portion 46''', and waveguide 49 starting at joint tips 406. In the power distributor of FIG. 23, the radial line portions of the prior embodiments are leveled to reduce generation of the higher mode electric field at the transition between the coaxial line path and the radial line path. The inclined portion 46''' introduces the microwave signal into the waveguides 49 smoothly, and the microwave signal is distributed in the waveguides 49. The length of the inclined portion 46''' is, preferably, greater than $\lambda/4$. The inclined portion can be replaced by a plurality of steps.

Figure 24:
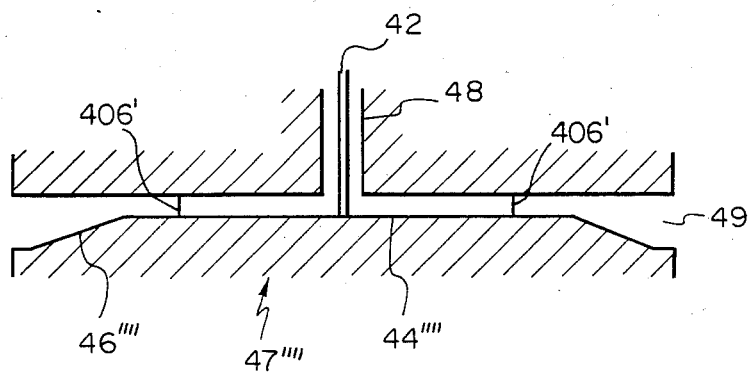
FIG. 24 is a sectional view of a sixth embodiment of the power distributor.

A sixth embodiment of the power distributor will be described with reference to FIG. 24. FIG. 24 is a sectional view of a power distributor similar to that of the power distributor shown in FIG. 23. A base 47'''' forms a center flat portion 44'''' that, unlike the power distributor shown in FIG. 23, extends to the wedge tips 406 and an inclined waveguide portion 46''''. In the power distributor of FIG. 24, the microwave signal is equally distributed in a gap between the center flat portion 44'''' and an upper flat portion facing the flat portion 44''''. The distributed signals are introduced to the waveguides 49. The features of the power distributor shown in FIG. 24 are similar to those of the power distributor shown in FIG. 23. The same modifications of shape of the power distributor shown in FIG. 23 apply to the power distributor shown in FIG. 24.

Figure 25:
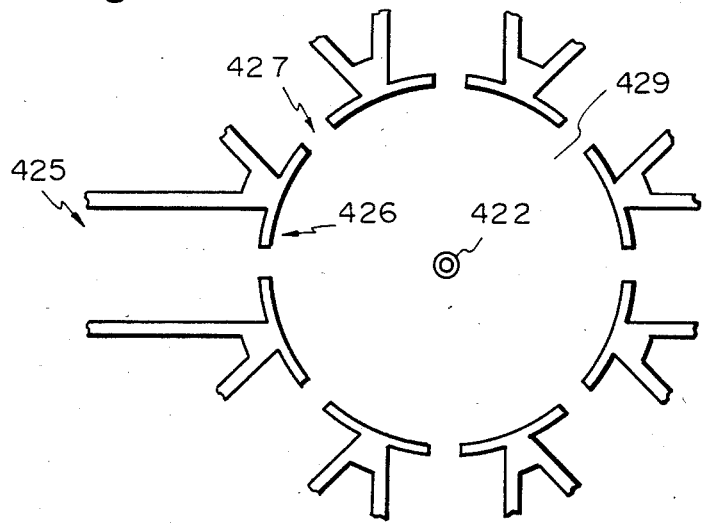
FIG. 25 is a plan sectional view of a seventh embodiment of the power distributor.
Figure 26:
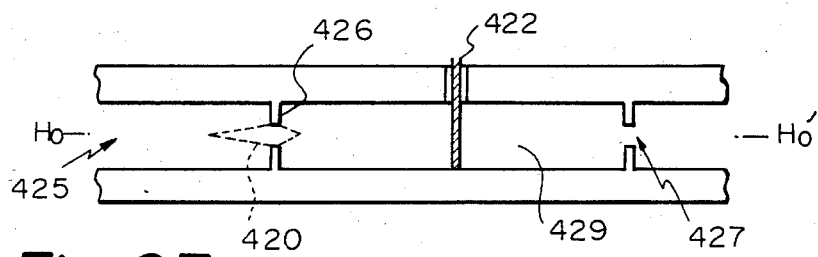
FIG. 26 is a side sectional view of the power distributor shown in FIG. 25.

A seventh embodiment of the power distributor will be described with reference to FIGS. 25 and 26. FIG. 25 is a plane sectional view of the power distributor. FIG. 26 is a side sectional view of the power distributor. The power distributor has a coaxial line path 422, circumferentially positioned waveguides 425, inner walls 426 having holes 427, and a cylindrical cavity 429 defined by the inner walls 426. The microwave signal propagated in the cavity 429 is changed to a radial mode and is equally distributed and introduced into the waveguides 425 through each of the holes 427. The holes 427 have the same dimensions and are positioned at equal distances. The semiconductor amplifiers are are coupled to the waveguides.

Figure 27:
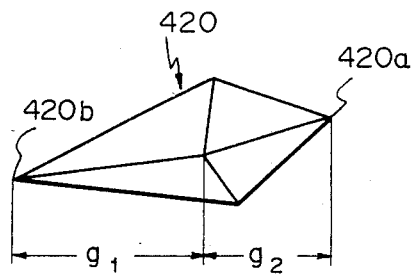
FIGS. 27 and 28 are perspective views of dielectric members used for the power distributor shown in FIG. 25.
Figure 28:
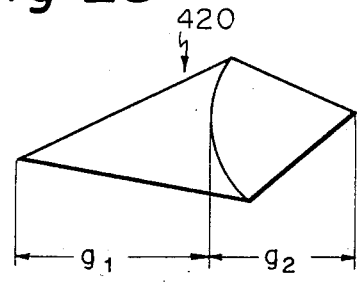

In this embodiment, there is the possibility of reflection of the microwave signal at the inner walls 426. Preferably, therefore, dielectric members 420 are inserted into the holes 427, as shown by a broken line in FIG. 26. The dielectric members converge the microwave signal at the tip facing the cavity to reduce the reflection. Two examples of the dielectric members are shown in FIGS. 27 and 28. The first dielectric member shown in FIG. 27 is a multifaceted double cone, i.e., two pyramids with a common base having many sides, while the second member shown in FIG. 28 is a double circular cone having a common base. The holes 427 are made so that the dielectric members can fit therein.

Figure 29:
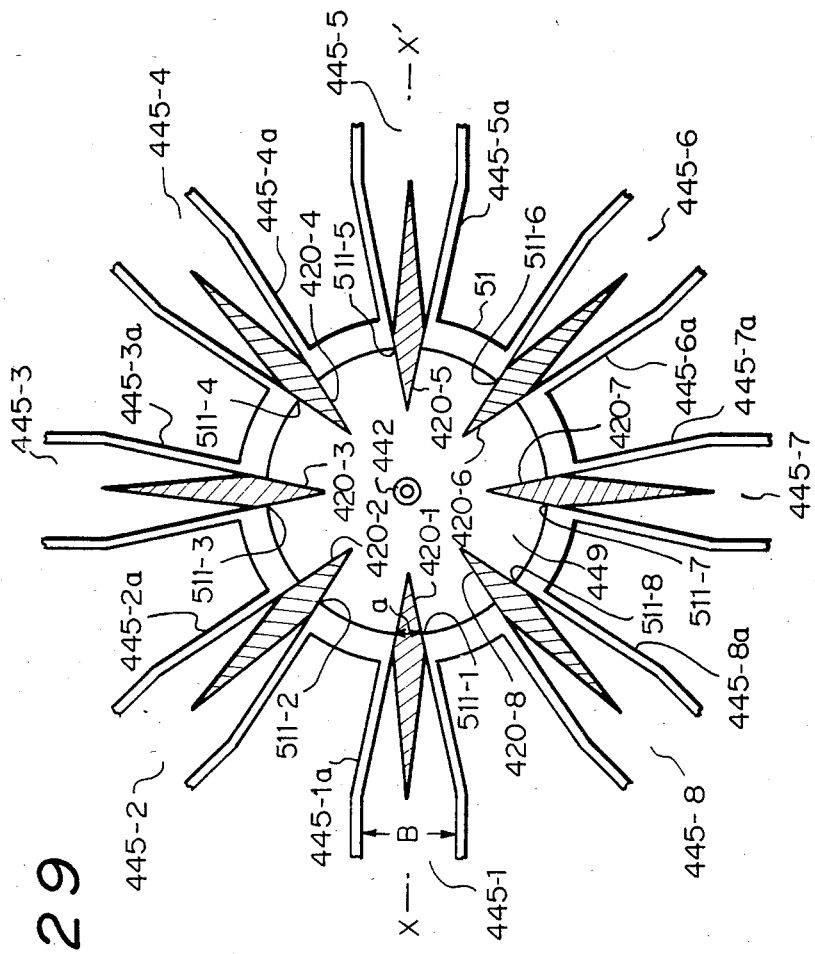
FIG. 29 is a sectional plane view of an eighth embodiment of the power distributor.
Figure 30:
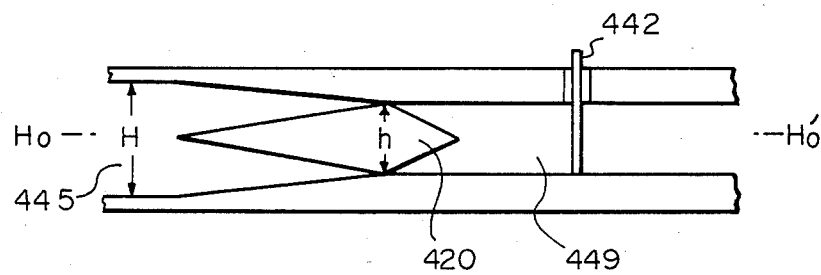
FIG. 30 is a side sectional view of the power distributor shown in FIG. 29, taken along the line X-X'.

An eighth embodiment of the power distributor will be described with reference to FIGS. 29 through 31. FIG. 29 is a plane sectional view of the power distributor. FIG. 30 is a partial side sectional view. The power distributor includes a vessel 51 having apertures 511-1 to 511-8 positioned at equal distances and defining a cavity 449, a coaxial line path 442, and waveguides 445-1 to 445-8. The waveguides 445-1 to 445-8 have tapered portions 445-1a to 445-8a, each of which is connected to the aperture of the vessel 51.

Figure 31:
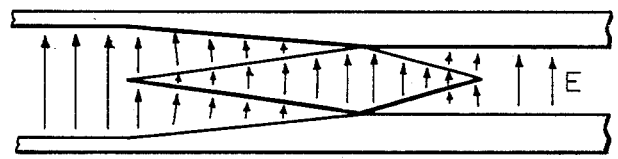
FIG. 31 is a side view of a channel in the power distributor shown in FIG. 25 or 29, illustrating the propagation of the microwave signal.

In operation, the microwave signal propagated in the cavity 449 with the TEM mode is converted to a radial mode and is equally distributed and introduced into the waveguides 445-1 to 445-8 through the apertures 511-1 to 511-8, as shown in FIG. 31.

Use of the tapered waveguide smooths the transition mode of the microwave signal propagation into the waveguides. A plurality of waveguides, i.e., the power distributing paths, can be radially provided rather than the above-mentioned distributor.

In the power distributor of FIGS. 29–30, there is the possibility of reflection at the inner wall of the vessel 51. For this reason, dielectric members 420-1 to 420-8, for example, as shown in FIGS. 27 and 28, are inserted into apertures 511-1 to 511-8. In operation, the microwave signal with the radial mode in the cavity 449 is equally concentrated on tips, each having a sharp shape, of the dielectric members 420-1 to 420-8. The trapped electric field of the microwave signals propagate in the dielectric members and are introduced into the waveguides. Consequently, the power loss is minimized, and the power distribution, phase, and amplitude can be improved. The size of the aperture 511-1 to 511-8 for connecting the cavity 449 and the waveguides 445-1 to 445-8 is considerably reduced. This means the joint portions are smaller than those of not only conventional power distributors but also the embodiments of power distributors shown in FIGS. 16 to 24.

Preferably, the cavity-side length of the dielectric member is approximately $\lambda/8$ to $\lambda/2$ and the waveguide-side length is greater than $\lambda/4$. The actual dimensions of the power distributor for 30 GHz with dielectric members 420-1 ro 420-8 having a specific inductive capacity of 10 are as follows:

Width of aperture a (FIG. 29): 2.7 mm
Height of aperture h (FIG. 30): 1.0 to 4.3 mm
Width of waveguides B (FIG. 29): 8.6 mm
Height of waveguides H (FIG. 30): 4.3 mm As clearly understood from the above, the microwave power amplifying apparatus can consist of any one of the above-mentioned power distributors, a plurality of semiconductor amplifiers, and any one of the above-mentioned power distributors used as a synthesizer. For example, the microwave power amplifying apparatus may comprise a ridge-distributing-path-type power distributor and a waveguide-type power synthesizer.

1. A microwave power distributing and synthesizing device, comprising:
   a first conductive base;
   a second conductive base facing said first conductive base at a first predetermined distance and having a hole with an inner conductive wall;
   coaxial line means for conducting microwave power in a coaxial mode, including an inner conductive member coaxially penetrating through the hole in said second conductive base and spaced from the inner conductive wall of the hole in said second conductive base by a second predetermined distance, having a first end supported by said first base and having a second end and forming an antenna protruding out of the hole in said second conductive base, the inner conductive wall of the hole in said second conductive base forming an outer conductive member of said coaxial line means;
   at least one electric field distributing and synthesizing means arranged perpendicularly to the first end of said coaxial line means, for distributing the microwave power propagated by said coaxial line means and for synthesizing the microwave power to said coaxial line means; and
   a plurality of waveguides operatively connected to said electric field distributing and synthesizing means.

2. A microwave power distributing and synthesizing device according to claim 1, wherein said electric field distributing and synthesizing means are plural and are circumferentially arranged with respect to said coaxial line means with equal angular spacing, each said electric field distributing and synthesizing means having at least one ridge attached to one of said first and second conductive bases and separated from the other of said first and second conductive bases by a third predetermined distance.

3. A microwave power distributing and synthesizing device according to claim 2, wherein said at least one ridge comprises:
- an inner end adjacent to said coaxial line means, which forms a part of the inner wall of said coaxial line means; and
- an outer end forming an inclined portion operatively connected to said waveguide.

4. A microwave power distributing and synthesizing device according to claim 2,
- wherein said at least one ridge comprises:
- an inner inclined portion opposite the bottom end of the inner conductive member; and
- an outer inclined portion operatively connected to the waveguide, and wherein a space is defined in part by the inner inclined portion of said at least one ridge.

5. A microwave power distributing and synthesizing device according to claim 3 or 4, wherein said at least one ridge is formed on said second conductive base.

6. A microwave power distributing and synthesizing device according to claim 2, 3 or 4, wherein said at least one ridge is formed on said first conductive base.

7. A microwave power distributing and synthesizing device according to claim 2, 3 or 4, wherein said at least one ridge includes two ridges, one formed on each of said first and second conductive bases.

8. A microwave power distributing and synthesizing device according to claim 2, wherein said at least one ridge is formed on said second conductive base.

9. A microwave power distributing and synthesizing device according to claim 8, wherein said device is operatively connectable to an amplifier and said at least one ridge comprises an outer edge operatively connectable to the amplifier.

10. A microwave power distributing and synthesizing device according to claim 9, wherein said device further comprises at least two resistance films operatively connected to said at least one ridge in neighboring electric field distributing and synthesizing means, said resistance films symmetrically positioned with respect to said coaxial line means.

11. A microwave power distributing and synthesizing device according to claim 1,
- further comprising a cavity around the bottom end of the inner conductive member of said coaxial line means, and
- wherein said waveguides have inner ends with joint tips and said electric field distributing and synthesizing means includes openings arranged circumferentially of the cavity and defined by the joint tips of the inner ends of said waveguides.

12. A microwave power distributing and synthesizing device according to claim 11,
- wherein said device processes a microwave signal having a wavelength, and
- wherein each of the joint tips has a gradient portion shaped as an isosceles triangle having an apex, the gradient portion having a length measured along a line from the first end of said coaxial line means and passing through the apex, the length being equal to or greater than one-fourth of the wavelength of the microwave signal.

13. A microwave power distributing and synthesizing device according to claim 11,
- wherein said device processes a microwave signal having a wavelength, and
- wherein each of said joint tips comprises first and second steps, each of the first and second steps forming an isosceles triangle having an angle at a tip, the second step being shorter than the first step and the angle of the second step being greater than the angle of the first step, a length from the tip of the first step to the tip of the second step being equal to or greater than one-fourth of the wavelength of the microwave signal.

14. A microwave power distributing and synthesizing device according to claim 11,
- wherein said device processes a microwave signal having a wavelength, and
- wherein each of the joint tips forms at least two steps from a lowest step to a highest step, the lowest step forming an isosceles triangle with a tip, the other steps having sides perpendicular to the tip of the lowest step, each of the steps having a step-height, the step-height of the steps decreasing from the lowest step to the highest step, a length from the tip of the lowest step to a plane of the highest step being equal to or greater than one-fourth of the wavelength of the microwave signal.

15. A microwave power distributing and synthesizing device according to claim 11, 9, 10 or 14, wherein said electric field distributing and synthesizing means comprises inclined portions concentric with the cavity and operatively connected to said waveguides via the openings.

16. A microwave power distributing and synthesizing device according to claim 11, 9, 10 or 14, wherein said electric field distributing and synthesizing means comprises inclined wave guide portions located between the openings and said waveguides and operatively connected to said waveguides.

17. A microwave power distributing and synthesizing device according to claim 1,
- further comprising a cavity defined by said first and second bases and a cylindrical enclosure located outside of and coaxially to the first end of said coaxial line means, and
- wherein said device includes more than one of said electric field distributing and synthesizing means, said electric field distributing and synthesizing means comprising holes in the cylindrical enclosure which are spaced at equal distances and connect the cavity to said waveguides.

18. A microwave power distributing and synthesizing device according to claim 17,
- wherein said device processes a microwave signal having an electric field, and
- wherein said device further comprises dielectric members tightly inserted into the holes, each of said dielectric members having acute angled tips, a first tip protruding into the cavity and a second tip protruding into one of said waveguides, said dielectric members concentrating and diffusing the electric field of the microwave signals.

19. A microwave power distributing and synthesizing device according to claim 1,
- further comprising a cavity around the first end of the inner conductor member of said coaxial line means and defined by a cylindrical enclosure having a circumference, wherein said at least one electric field distributing and synthesizing means includes a hole with an inner diameter in the circumference of the cylindrical enclosure defining the cavity, the hole connecting the cavity to one of said waveguides, and wherein each of said waveguides has a tapered end having an inner diameter equal to the inner diameter of the hole included in said power distributing and synthesizing means.

20. A microwave power distributing and synthesizing device according to claim 19, wherein said device processes a microwave signal having an electric field, and wherein said device further comprises a plurality of dielectric members tightly inserted into said holes, each of said dielectric members having acute angled tips, a first tip protruding into the cavity and a second tip protruding into one of said waveguides, said dielectric members concentrating and diffusing the electric field of the microwave signal.

21. A microwave power distributing and synthesizing device according to claim 18 or 20, wherein each of said dielectric members comprises two cones having a common base and each having an acute angle tip to perform one of the concentrating and diffusing of the electric field of the microwave signal.

22. A microwave power distributing and synthesizing device according to claim 18 or 20, wherein said dielectric member forms two multiple side cones each having an acute angle tip to concentrate or diffuse the electric field of the microwave signal.

23. A microwave power distributing and synthesizing device according to claim 1, wherein said coaxial line means further includes a dielectric member inserted between the inner wall of the hole in the second conductive base and the inner conductive member.

24. A microwave power amplifying apparatus, comprising:

a first microwave power distributing and synthesizing means, operatively connected to receive an input microwave signal for receiving and distributing the input microwave signal, comprising:
   a first conductive base;
   a second conductive base facing said first conductive base at a first predetermined distance and having a hole with an inner conductive wall;
   first coaxial lines means for conducting microwave power in a coaxial mode, including an inner conductive member penetrating through the hole in said second conductive base and spaced from the inner conductive wall of the hole in said second conductive base by a second predetermined distance, having a first end supported by said first conductive base and having a second end operatively connected to receive the input microwave signal, the inner conductive wall of the hole in said second conductive base forming an outer conductive member of said first coaxial line means;
   first electric field distributing and synthesizing means arranged perpendicular to the first end of said first coaxial line means; and
   a first group of waveguides operatively connected to said first group of electric field distributing and synthesizing means;
amplifiers operatively connected to said first group of waveguides of said first microwave power distributing and synthesizing means; and
a second microwave power distributing and synthesizing means, comprising:
   a second group of waveguides operatively connected to said amplifiers;
   second electric field distributing and synthesizing means operatively connected to said second group of waveguides;
   a third conductive base;
   a fourth conductive base facing the third conductive base at a third predetermined distance and having a hole with an inner conductive wall; and
   second coaxial line means for conducting microwave power in a coaxial mode, including an inner conductive member coaxially penetrating through the hole in said fourth conductive base and spaced from the inner conductive wall of the hole in said fourth conductive base by a fourth predetermined distance, having a first end supported by said third conductive base and having a second end for outputting an amplified microwave signal, the inner conductive wall of the hole in said fourth conductive base forming an outer conductive member of said second coaxial line means.

25. A microwave power distributing and synthesizing device, comprising:

a first conductive base;
a second conductive base separated from said first conductive base to form a cavity therebetween, and having a hole;
conductive rod means, having an end supported by said first conductive base, and passing through and electrically insulated from the hole in said second conductive base, for conducting a microwave signal into or out of the cavity;
electric field distributing and synthesizing means, operatively coupled to the cavity, for at least one of distributing and synthesizing the microwave signal; and
waveguides operatively coupled to said electric field distributing and synthesizing means and symmetrically spaced in a circle, the end of said conductive rod means being substantially at the center of the circle.

26. A microwave power distributing and synthesizing device according to claim 25, wherein said waveguides have inner ends with joint tips, and wherein said electric field distributing and synthesizing means comprises a cylindrical wall of the cavity formed between said first and second conductive bases and includes openings in the cylindrical wall defined by the inner ends and joint tips of said waveguides.

27. A microwave power distributing and synthesizing device according to claim 26, wherein said device processes a microwave signal having a wavelength, and wherein each of the joint tips contacts one of said first and second conductive bases at a first point with a first distance from the end of said conductive rod means and contacts the other of said first and second conductive bases at the second point with a second distance from the bottom end of said conductive rod means, the second distance being larger than the first distance by an amount at least as large as one-fourth of the wavelength.

28. A microwave power distributing and synthesizing device according to claim 27, wherein each of the joint tips has an isosceles triangular shape with an apex at the first point and a base having a center at the second point.

29. A microwave power distributing and synthesizing device according to claim 27, wherein each of the joint tips comprises:
- a first step with a tip at the first point and two symmetrical sides forming a first angle therebetween; and
- a second step with a tip at the second point and another two symmetrical sides forming a second angle, larger than the first angle, therebetween.

30. A microwave power distributing and synthesizing device according to claim 27, wherein each of the joint tips comprises:
- a first step having a tip at the first point and two symmetrical sides forming an angle therebetween, arranged so that a line bisecting the angle passes through the end of said coaxial line means; and
- a second step having a side perpendicular to the line bisecting the angle of said first step, the side of said second step having a center at the second point.

* * * * *

UNITED STATES PATENT AND TRADEMARK OFFICE
CERTIFICATE OF CORRECTION

PATENT NO. : 4,598,254

DATED : July 1, 1986

INVENTOR(S) : Saito et al.

It is certified that error appears in the above-identified patent and that said Letters Patent is hereby corrected as shown below:

Col. 4, line 50, "$1_0$" should be --$\ell_0$--.

Col. 6, line 8, "$1_1$" should be --$\ell_1$--;
line 10, "$1_0$" should be --$\ell_0$--.

Col. 8, line 14, "$1_2$" should be --$\ell_2$--;
line 26, "$1_2'$" should be --$\ell_2'$--;
line 30, "$1_2''$" should be --$\ell_2''$--;
line 35, "$1_2'''$" should be --$\ell_2'''$--;
line 37, delete "cut";
line 47, "1" should be --$\ell$--.

Col. 9, line 4, "406" should be --406',--.

UNITED STATES PATENT AND TRADEMARK OFFICE
CERTIFICATE OF CORRECTION

PATENT NO. : 4,598,254

DATED : July 1, 1986

INVENTOR(S) : Saito et al.

It is certified that error appears in the above-identified patent and that said Letters Patent is hereby corrected as shown below:

Col. 10, line 6, "aperture" should be --apertures--;
    line 16, "ro" should be --to--.

Col. 12, Claim 15, line 26, "11, 9, 10 or 14,"
    should be --11, 12, 13 or 14,--;

Claim 16, line 32, "11, 9, 10 or 14," should be
    --11, 12, 13 or 14,--.

Signed and Sealed this

Twenty-eighth Day of October, 1986

[SEAL]

Attest:

DONALD J. QUIGG

*Attesting Officer*  *Commissioner of Patents and Trademarks*